United States Patent [19]

Rougeot et al.

[11] Patent Number: 5,198,673
[45] Date of Patent: Mar. 30, 1993

[54] RADIATION IMAGE DETECTOR WITH OPTICAL GAIN SELENIUM PHOTOSENSORS

[75] Inventors: Henri M. Rougeot; George E. Possin, both of Schenectady, N.Y.

[73] Assignee: General Electric Company, Schenectady, N.Y.

[21] Appl. No.: 824,270

[22] Filed: Jan. 23, 1992

[51] Int. Cl.$^5$ .......................... G01T 1/24; G01T 1/20
[52] U.S. Cl. .......................... 250/370.11; 250/370.09
[58] Field of Search .................. 250/370.09, 370.11

[56] References Cited

U.S. PATENT DOCUMENTS

| | | | |
|---|---|---|---|
| 3,800,194 | 3/1974 | Maruyama et al. | 317/235 R |
| 4,330,733 | 5/1982 | Shidara et al. | 313/386 |
| 4,363,969 | 12/1982 | Ong | 250/370.09 |
| 4,672,207 | 6/1987 | Derenzo | 250/363 S |
| 4,799,094 | 1/1989 | Rougeot | 250/370.11 |
| 4,810,881 | 3/1989 | Berger et al. | 250/370.09 |
| 5,079,426 | 1/1992 | Antonuk et al. | 250/370.11 |
| 5,101,255 | 3/1992 | Ishioka et al. | 357/2 |
| 5,113,077 | 5/1992 | Shimizu et al. | 250/370.11 |

OTHER PUBLICATIONS

Entine et al., "Scintillation Detectors Using Large Area Silicon Avalanche Photodiodes", IEEE Trans. Nucl. Sci., NS-30, (1), Feb. 1983, pp. 431-435.
Petrillo et al., "Scintillation Detection with Large-Area Reach-Through Avalanche Photodiodes", IEEE Trans. Nucl. Sci., NS-31 (1), Feb. 1984, pp. 417-423.
"Avalanche Multiplication in Amorphous Selenium" by K. Tsuji et al., Central Research Lab., Hitachi, Ltd. Kokubunji, Tokyo 185, Japan, 19th Conference on Solid State Devices and Materials, Aug. 25-27, 1987, Tokyo Japan.

Primary Examiner—Carolyn E. Fields
Attorney, Agent, or Firm—Donald S. Ingraham; Marvin Snyder

[57] ABSTRACT

A large area radiation imager having a scintillator, an amorphous selenium photosensor, and a non-linear high voltage protective device employs a selected biasing voltage between about 100 volts and 1000 volts at the selenium photosensor to cause the photosensor to exhibit avalanche multiplication. The photosensor has an area not less than about 100 square centimeters. The amorphous selenium is doped slightly with arsenic or arsenic and tellurium. The device is advantageously coupled to a data read and reset circuit to selectively read charge generated in pixels of the photosensor. The read and data circuit is protected from an overvoltage condition by the non linear high voltage protective device, such as a protective thin film transistor or a two terminal protective device. The protective TFT is structured to have a relatively thick gate dielectric layer, which thickness is selected to cause the protective TFT to have a threshold voltage corresponding to a desired protective voltage.

25 Claims, 3 Drawing Sheets

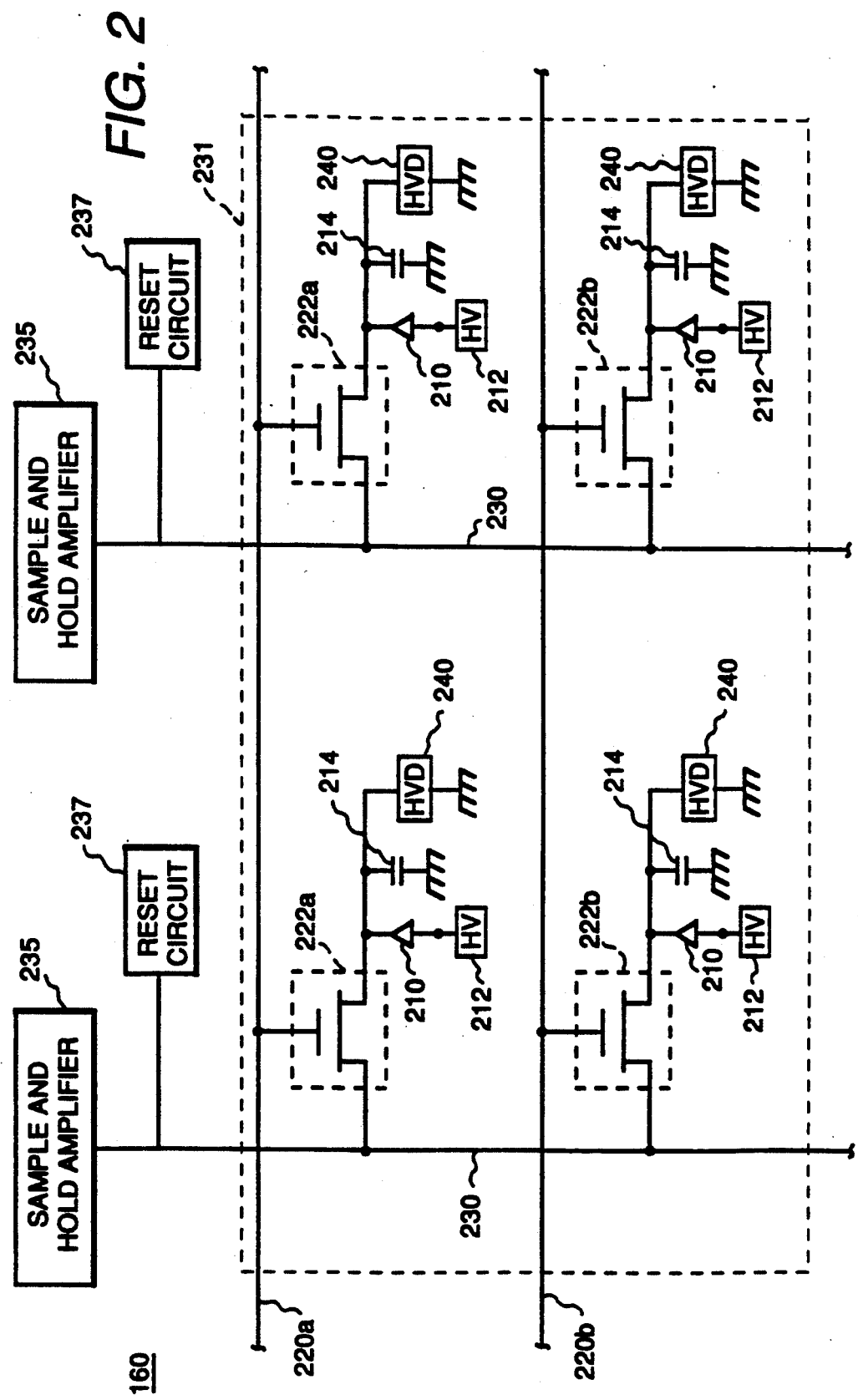

RADIATION IMAGE DETECTOR WITH OPTICAL GAIN SELENIUM PHOTOSENSORS

FIELD OF THE INVENTION

This invention relates generally to the field of radiation imagers and in particular to large area x-ray detectors having scintillators and photodetectors.

BACKGROUND OF THE INVENTION

Radiation imagers are widely used in medical diagnostic tests, industrial non-destructive evaluation, and scientific research. Large area radiation detectors, i.e. having a detection area exposed to the incident radiation of more than about 100 square centimeters, have conventionally comprised intensifier screens or stimulated phosphors.

In an intensifier screen x-ray detector, for example, the incident radiation strikes a phosphor layer which converts the x-ray radiation into a light image. In a typical arrangement, an optical lens focused on the phosphor screen couples the light output to a television camera which generates an associated electrical signal that can be processed and displayed. A major drawback of the phosphor intensifier screen device is that it lacks the sensitivity and acuity demanded in medical, scientific, and industrial testing and analysis, and is cumbersome because of the amount of television equipment required to produce the image.

A stimulated phosphor device is a flat panel x-ray sensor in which the incident x-ray flux stimulates electrons in the phosphor layer, which are then stored in electron traps at the higher energy state. The phosphor panel is read or analyzed by a laser beam sweeping over the panel, detrapping the electrons and causing a radiative recombination in which light of a different wavelength than the laser beam is emitted. A photodetector sensitive to the emitted light collects the emitted light and generates an electrical signal which is processed to produce an image on conventional display equipment. This type of detector does not allow for real-time presentation of x-ray images, and similarly has sensitivity limitations which restrict its use in many testing and analysis applications.

Panel radiation converters have been proposed which use radiation absorbent scintillators coupled to photodetectors such as photodiodes. For example, a solid state radiation imager is disclosed by S. E. Derenzo in U.S. Pat. No. 4,672,207, issued Jun. 9, 1987. In the Derenzo device, radiation incident on the detector strikes a scintillator which is divided into rows and columns. An array of photodetectors underlies the scintillator and generates electrical signals dependent on the light produced in the scintillator as the radiation is absorbed. Derenzo discloses the use of silicon avalanche photodiodes as photodetectors. There are, however, several drawbacks to the Derenzo device that would be noted by a user, such as the high noise and low sensitivity of the data collection and amplification circuits disclosed in the patent and the difficulty of adapting the Derenzo device to a large area array using the crystalline silicon photodiodes disclosed in the patent. Another approach to a high resolution camera for radiation imaging is disclosed in the copending patent application entitled "Photodetector Scintillator Radiation Imager," Ser. No. 07/746,847, filed Aug. 19, 1991, now U.S. Pat. No. 5,144,141, of H. Rougeot, et al., and assigned to the assignee of the present invention.

It is difficult in a mass production process to uniformly fabricate the large number of avalanche photodiodes (APDs) necessary for a large area array when the APDs are made of silicon, gallium arsenide, or other monocrystalline photosensitive materials. Such materials are not readily deposited and patterned in large arrays with traditional semiconductor fabrication techniques. It is desirable to use an amorphous material that exhibits avalanche gain multiplication, i.e. a gain of $10 \times$ or more, and which can readily be fabricated in a large area array in devices requiring large gain.

Avalanche multiplication has been observed in amorphous selenium, as reported by K. Tsuiji et al. in "Avalanche Multiplication in Amorphous Selenium," Extended Abstracts of the 19th Conference on Solid State Devices and Materials, Japan Society of Applied Physics August 1987, pp. 91-94. Amorphous selenium, when polarized to a high voltage (i.e., greater than about $10^6$ volts/cm) to cause avalanche multiplication, exhibits high ionization rates with comparatively low noise. Although amorphous selenium has been used as a photosensitive material in photodiodes for facsimile machines, photocopiers, and the like, in such uses the biasing voltage is relatively low (about 100 volts or less) and the avalanche effect is not used. Small size, i.e. between 1 cm$^2$ and 5 cm$^2$, amorphous selenium arrays have been proposed for use in in low light conditions in certain television camera devices in which it is thought the avalanche effect could be used.

It is therefore an object of this invention to provide a photosensor for a high sensitivity large area radiation detection array that is readily fabricated and that exhibits avalanche multiplication when in use.

It is a further object of this invention to provide a radiation detector capable of operating at the high voltages necessary to obtain avalanche characteristics in the photosensor while protecting associated data read and amplification circuitry.

It is a still further object of this invention to provide a high gain, low noise photosensitive radiation detection array for real time detection and display of x-ray radiation having low energy levels.

SUMMARY OF THE INVENTION

A radiation imaging device comprises a scintillator and a large area photosensor having an amorphous selenium photosensitive material that exhibits avalanche multiplication gain when a selected high biasing voltage is applied. A data read and reset circuit is electrically coupled to the photosensor to selectively read the charge generated in the photosensor in response to incident light, and a high voltage nonlinear device is coupled to the read and reset circuit to provide overvoltage protection from the selected high biasing voltage. The scintillator and the photosensor can comprise separate elements or pixels arranged in a two dimensional array to enhance the spatial resolution of the device.

The selected high biasing voltage is between about 100 volts and 1000 volts and the photosensor has an area of not less than about 100 square centimeters. The amorphous selenium is preferably doped with arsenic or arsenic and tellurium and is disposed in the photosensor between a transparent electrode and a blocking barrier. The arsenic improves the amorphous structure stability of the selenium and the tellurium is typically added to shift the wavelength sensitivity of the material. The blocking barrier substantially prevents the passage of holes from an underlying contact electrode into the amorphous selenium layer, thus reducing noise. The blocking barrier is typically made of cerium oxide. The voltage potential between the contact electrode and the transparent electrode provides the selected high biasing voltage that causes the amorphous selenium layer to exhibit avalanche multiplication when incident light is absorbed.

The scintillator material generates light when it absorbs incident radiation. The generated light is absorbed by the amorphous selenium photosensor, and the resultant charge is multiplied by the avalanche phenomenon. The data read and reset circuit selectively samples or reads the charge generated in pixels in the photosensor array to produce a signal which is further amplified and processed to generate a visual display or processed further for analysis of the incident radiation.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIG. 2 is a part schematic and part block diagram of the data read and reset circuit of the present invention.

DETAILED DESCRIPTION OF THE PREFERRED EMBODIMENT

Figure 1B:
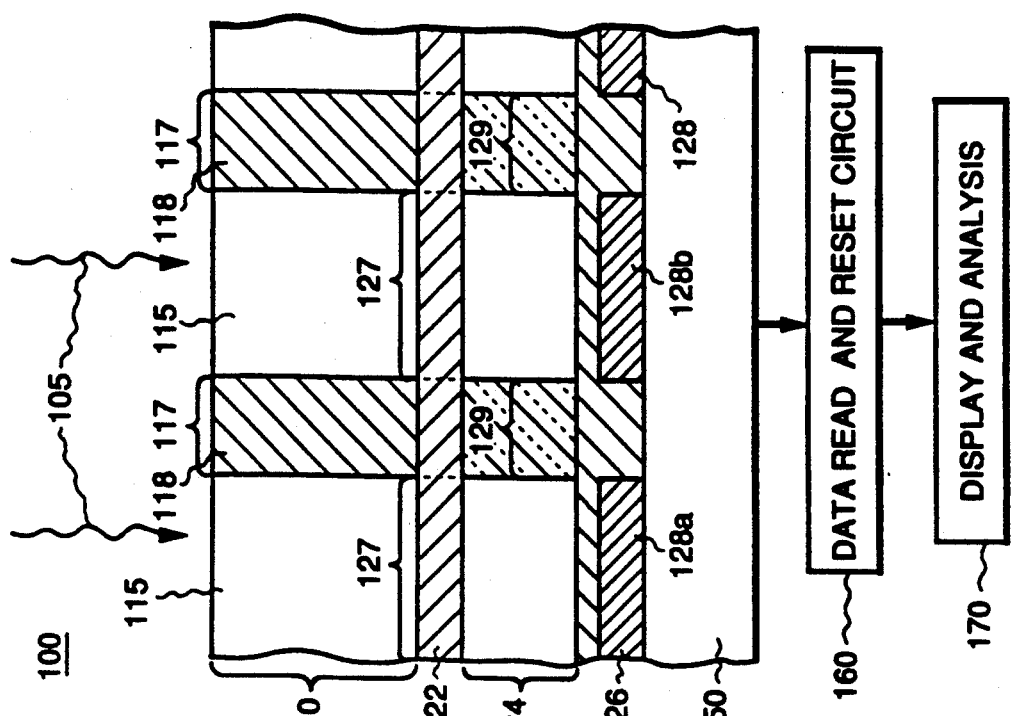
FIG. 1(b) is a partial cross-sectional view of the an imaging device constructed in accordance with another embodiment of this invention.
Figure 1A:
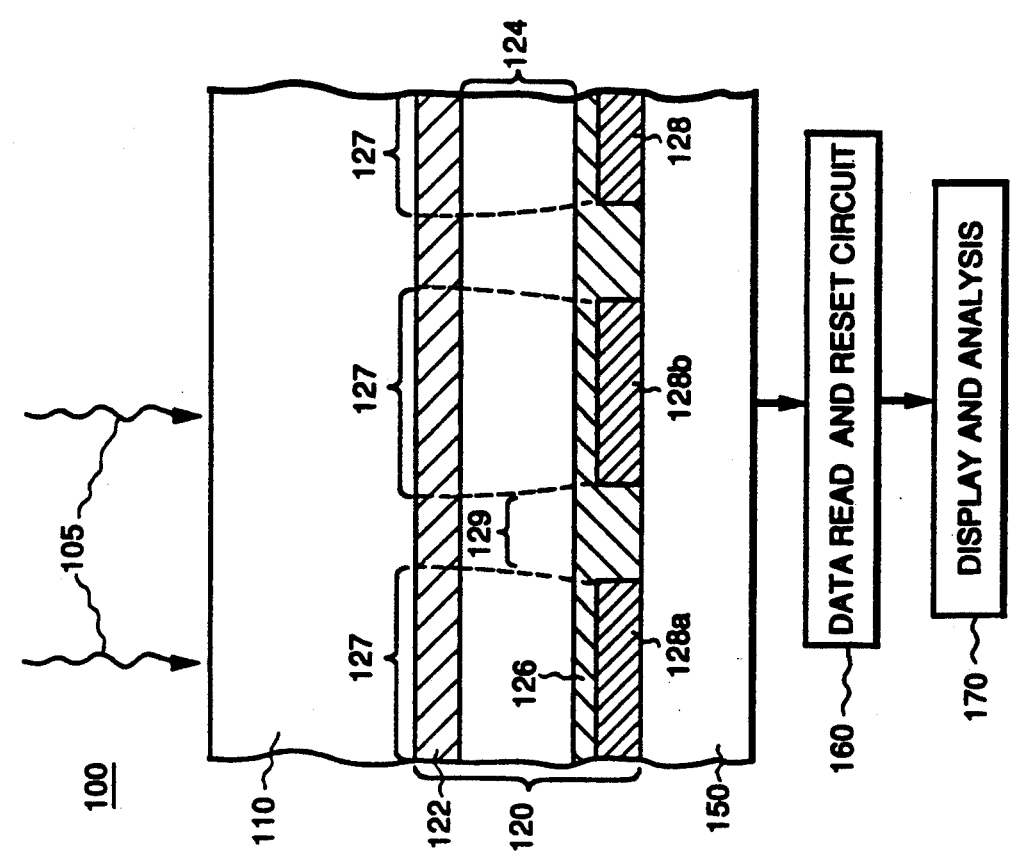
FIG. 1(a) is a partial cross-sectional view of the an imaging device constructed in accordance with one embodiment of this invention.

In FIG. 1(a), a radiation imaging device 100 is shown comprising a scintillator 110 optically coupled to a large area photosensor 120. Photosensor 120 is disposed on a substrate 150 and is electrically coupled to a data read and reset circuit 160. The output signals of read and reset circuit 160 are preferably coupled to a display and analysis circuit 170.

Incident radiation 105 typically comprises x-rays. The structure of the imaging device of this invention is, however, adaptable to the detection of other types of radiation, such as gamma rays, neutrons, or high energy charged particles, provided the appropriate scintillator material is selected. For ease of description, incident radiation is referred to herein as "rays," although, dependent upon the type of radiation to be detected, particles or other nomenclature known in the art may be used to describe the radiation. "Radiation" is used to refer to the electromagnetic energy or energetic charged particles the imaging device is to detect (e.g., x-rays or beta particles) and the words "light" or "optical" are used to refer to visible light or photons that are produced by the scintillator material when it interacts with the incident radiation. In typical medical imaging devices, the energy level of the incident x-ray radiation ranges between about 20 Kev and 150 Kev. In this energy range, typical interactions between the incident radiation and the scintillator material include photoelectric absorption and Compton scattering. Both of these processes result in electrons being emitted from atoms of the scintillator material that are struck by the incident radiation ray, and as these electrons pass through the scintillator material their energy is converted to visible radiant light energy. Thus, when a flux of x-rays excite the scintillator, a corresponding flux of light is generated which then strikes photosensor 120.

Scintillator 110 preferably comprises a substantially optically transparent scintillating material such as cesium iodide. Alternative scintillator materials include cadmium tungstate, zinc cadmium sulfide doped with silver, yttrium oxisulfide doped with europium, or gadolinium oxisulfide doped with europium or terbium. Scintillator 110 comprises a single coplanar layer of scintillator material as illustrated in FIG. 1(a) or alternatively comprises a plurality of substantially columnar-shaped scintillator elements 115 having interstitial spaces 117 advantageously filled with a radiation absorbent and optically reflective material 118, such as tungsten, platinum or silver, disposed therebetween as illustrated in FIG. 1(b). For an x-ray imager, scintillator 110 advantageously comprises a plurality of cesium iodide columnar scintillator elements having a thickness of about 300 microns.

Photosensor 120 is optically coupled to scintillator 110 to receive light generated in the scintillator when incident radiation is absorbed. In accordance with this invention, photosensor 120 is a large area photosensor, i.e., having a cross-sectional area larger than about 100 square centimeters. The area of the photosensor corresponds to the panel size used in the radiation imagers, and sophisticated x-ray imagers of the type employing the present invention typically have a panel size of about 40 cm by 40 cm.

As illustrated in FIG. 1(a), photosensor 120 comprises a substantially optically transparent electrode 122 through which light passes from the scintillator into the photosensor. In accordance with this invention, a layer 124 of amorphous selenium photosensitive material is disposed in electrical contact with transparent electrode 122, and a blocking barrier 126 is disposed along the surface of the selenium layer opposite the transparent electrode. A contact electrode 128 is disposed in electrical contact with the blocking layer.

Transparent electrode 122 advantageously comprises indium tin oxide having a thickness between about 15 nm and 100 nm. The amorphous selenium photosensitive material is advantageously doped with arsenic (approximately 10% by molecular weight) to improve its stability. Alternatively, the amorphous selenium doped with arsenic is doped with tellurium (approximately 5–10% by molecular weight) to obtain a desired redshift in the wavelength of the light emitted. Additionally, a relatively small portion of the amorphous selenium adjoining the barrier layer, i.e. having a thickness of about 20 nm to 60 nm, is advantageously doped with lithium fluoride to weaken the electric field in the immediate vicinity of blocking barrier 126 and thus to enhance the effectiveness of blocking barrier 126 as a barrier to hole passage. The amorphous selenium layer typically has a thickness in the range between about 0.5 $\mu$m and 10 $\mu$m.

The amorphous selenium layer exhibits avalanche multiplication gain when biased or polarized at a selected high biasing voltage. The interaction in which a light photon is absorbed in the amorphous selenium photosensitive material generates a charge, i.e., a free hole. The charge is accelerated under the influence of the biasing voltage, causing further ionizations or production of charge in an "avalanche" as it is drawn to the electrode of opposite polarity in the photosensor. Thus a single event of absorption of a light photon typically results in the accumulation of ten to several hundred times the amount of charge that is generated solely by the absorption event. The multiplication of the charge corresponds to the selected biasing voltage, among other variables. Due to the large ratio of hole multiplication to electron multiplication in the amorphous selenium layer, such a photosensor provides high gain with relatively low noise.

Blocking barrier 126 is disposed between the amorphous selenium layer and contact electrode 128 to prevent the passage of holes from the contact electrode into the selenium photosensitive material. The blocking layer ensures that substantially only charge generated within the amorphous selenium layer is collected at the photosensor electrodes. Blocking layer 126 preferably comprises cerium oxide and has a thickness of about 50 to 200 Å.

Contact electrode 128 is disposed adjoining the blocking layer and comprises a layer of conductive material, for example molybdenum, titanium, tungsten, chromium, gold, nickel, or the like. Contact electrode 128 is typically patterned to form a plurality of contact electrode pads, representative examples of which are identified as 128a and 128b in FIGS. 1(a) and 1(b). Each of these pads has a surface area in contact with the blocking layer of about 1 to 5 mm$^2$ for a nuclear (gamma ray) detector and about 0.2 mm$^2$ for a typical radiographic (x-ray) device. The patterned electrode pads and the photosensor layers disposed in the area over them form a plurality of photosensor elements or pixels 127, which are outlined in FIG. 1(a) in phantom. These pixels typically are arranged in a two-dimensional array over the surface of substrate 150. Light photons generated in the scintillator in response to incident radiation strike the photosensor and cause charge to be generated and collected in pixels in the area where the light struck the photosensor 120. The localization of the charge collection in response to the incident light provides improved resolution of the radiation detector array. As illustrated in FIG. 1(a), amorphous selenium layer 124 is coplanar, that is, substantially extending over the same area as transparent electrode 122. Due to the relatively high resistivity of the amorphous selenium, approximately 10$^{14}$ ohms/cm, there is little propagation of the charge between pixels 127 across an intermediate area 129 disposed between the pixels.

In the alternative embodiment illustrated in FIG. 1(b), the amorphous selenium layer is patterned to physically remove the intermediate layer portions 129 to physically separate the pixels 127. Advantageously a dielectric material is disposed in intermediate areas 129 between the respective pixels 127.

In accordance with this invention, a selected high biasing voltage is applied to each photosensor pixel 127 so that the amorphous selenium photosensor material exhibits avalanche characteristics. The biasing voltage is typically selected to optimize the avalanche gain while minimizing the noise generated in the photosensor, and the selected high biasing voltage preferably is between about 100 volts and 1000 volts, with the negative voltage applied on the transparent electrode side.

The charge generated in photosensor 120 in the large area array is sampled by data read and reset circuit 160, a representative portion of which is illustrated in FIG. 2. The data read and reset circuit comprises a plurality of photosensor pixels 210, each of which is electrically coupled to a high voltage source 212 and to a row and a column of a scan line 220 and a data line 230 respectively. Advantageously a storage capacitor 214 is coupled in parallel with each photosensor pixel 210, respectively, to hold the signal charge. The capacitance of storage capacitor 214 is selected in part based on the size of the pixel, with smaller size pixels requiring storage capacitors with less capacitance (e.g., a storage capacitor associated with a 200 micron square pixel would typically have a capacitance of between 10 pf and 100 pf). Each data line is selectively coupled to respective photosensor pixel elements via a respective scan switch 222. Scan switch 222 is advantageously an array thin film transistor (TFT) that is controlled by electrical signals on the respective scan line to which it is coupled. Other switching devices in the data read and reset circuit are similarly typically array TFTs or alternatively are advantageously conventional semiconductor switches electrically coupled to the imaging array using standard methods. Each data line is coupled to a respective sample and hold amplifier 235 and a respective reset circuit 237. Sample and hold amplifier 235 advantageously comprises a double sampling circuit to reject noise.

In FIG. 2, the suffix "a" is applied to the respective number for devices situated in a first row of a switching matrix 231, the suffix "b" is applied to the reference number for devices situated in a second row of matrix 231, etc. Thus, in a typical data sampling sequence, initially the amplifier level is read from each sample and hold amplifier 235. Next, the charge generated in each photosensor pixel 210a and stored on its associated capacitor 214a and the diode capacitance is read by causing scan switches 222a to become conductive in response to a signal on a row or scan line 220a. The stored charge on capacitor 214a is thus supplied through scan switch 222 to sample and hold amplifier 235 via data line 230. After the charge has been sampled, each amplifier 235 is reset using its associated reset circuit 237 in preparation for the next sampling sequence to occur in response to a signal on the next row or scan line 220b.

In accordance with this invention, the read and data circuit comprises a plurality of high voltage protective devices 240 electrically coupled to provide overvoltage protection from the selected high biasing voltage. The high biasing voltage is applied to photosensor pixel 210 by a common negative high voltage power supply applied to the substantially transparent electrode, i.e., the common indium tin oxide electrode. High voltage source 212 preferably derives the voltage from a central source for the array or alternatively may comprise separate voltage sources for portions of the array. The selected high biasing voltage, when applied to photosensors 210, causes the photosensor pixels to operate in the avalanche range. The high biasing voltages are in excess of the voltages to which the remainder of the read and reset circuit, such as the array TFTs and the sample and hold amplifiers, may safely be exposed. Consequently, should the photosensor pixel capacitance drift towards the high biasing voltage due to excess light, catastrophic discharge, failure of timing circuitry, or the like, high voltage protective device 240 is necessary to prevent the high voltage from being applied to the data read and reset circuit.

Figure 3:
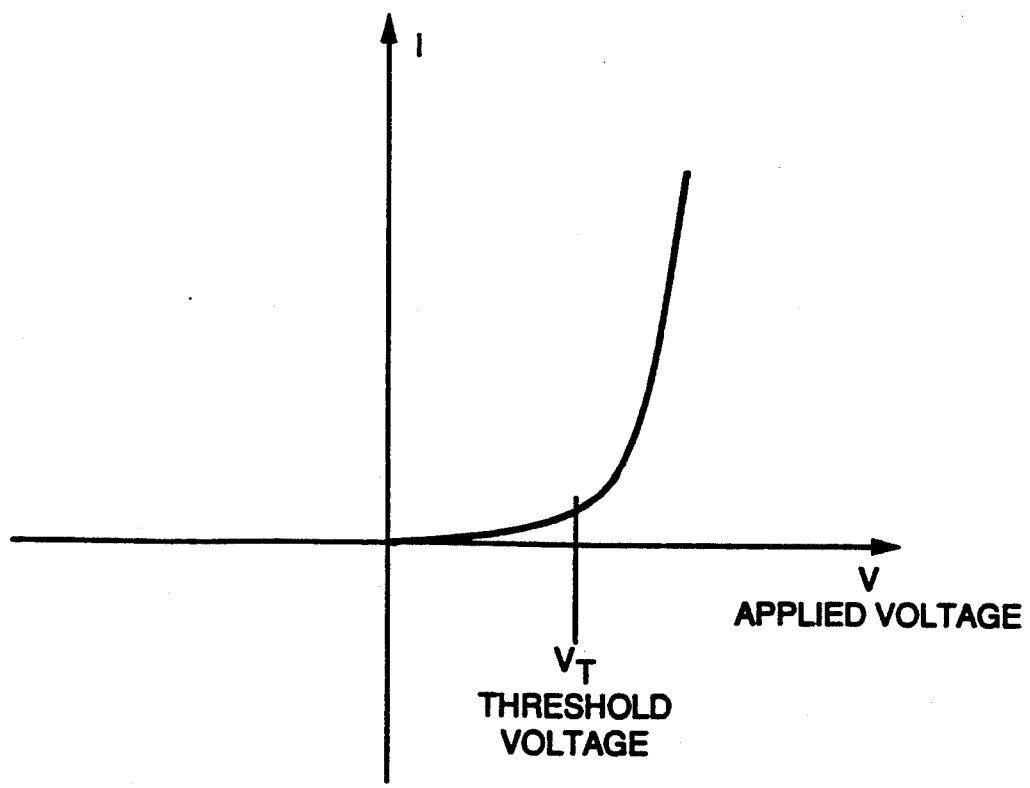
FIG. 3 is a graphic representation of the current-voltage characteristic of a high voltage protective device in accordance with this invention.

High voltage protective device 240 is non linear, i.e., it exhibits a current-voltage characteristics in which it is substantially non-conductive up to a selected threshold voltage $V_T$, and at potentials above the threshold voltage, the device becomes highly conductive. The threshold voltage corresponds to a selected protective voltage at which it is preferable to have the protective device become conductive to prevent an overvoltage condition and the consequent damage to the read and reset circuit. The protective voltage is typically selected to prevent the data read and reset circuit from attaining an electrical potential in excess of about 10 volts. A representative plot of such a current-voltage characteristic appears in FIG. 3. The high voltage protective device preferably comprises a protective TFT which differs in performance from the array TFTs used for the scan and read switches in the array in that the protective device has a higher threshold voltage. Further, the gate electrode of an amorphous silicon (i.e., n-channel) protective TFT is connected to either the source or the drain electrode of the TFT that will be exposed to the most positive voltage. The threshold voltage in the protective TFT is between about 2 volts and 10 volts, which is higher than the typical array TFT threshold voltage range of about 0 and 3 volts. The protective TFT advantageously has a thick gate dielectric layer, e.g., a thickness of about 1.0 microns, which is about three to six times the thickness used in conventional array TFTs. The remaining structure of the protective TFT is similar to the array TFTs. One way to fabricate an array with individual TFT's in the array having different dielectric thicknesses is to deposit a thick (about 1.0 microns) layer of dielectric material, e.g., $SiO_2$ or SiN; selectively remove this dielectric material from the gate regions of the array TFT's; and then deposit the remaining conductive, semiconductive, and dielectric material layers to form the TFTs in accordance with known TFT fabrication techniques. Alternatively, high voltage TFTs or two terminal protective devices, such as Zener diodes, avalanche diodes, and reach-through diodes, can be used as the high voltage device to provide overvoltage protection to the read and reset circuit.

When an overvoltage condition exists, that is when the voltage on the output contact of the photosensor pixel coupleable to the data line drifts above a predetermined value, the high voltage device becomes conductive and shorts the photosensor pixel output contact to ground, thus preventing a high voltage from being applied to the remainder of the read and reset circuit. The predetermined value at which the high voltage device becomes conductive corresponds to the threshold voltage of the protective TFT and is selected to have the protective device become conductive before a voltage high enough to be detrimental to the data read and reset appears on the circuit. When the protective TFT is conductive to prevent an overvoltage condition, it has an on-state resistance of about 0.1 Mohms or less, depending on device size. It is desirable for this on-state resistance to be as small as possible and at least smaller than the dark current leakage of an individual avalanche photodetecting element.

In operation, radiation imaging device 100 of FIGS. 1a and 1b is positioned in the path of the radiation desired to be detected. The absorption of rays of incident radiation in scintillator 110 results in the generation of light photons which in turn strike photosensor 120. The light photons absorbed in the amorphous selenium photosensor material in photosensor 120 generate charge, such as free holes that are accelerated towards an electrode under the influence of a high biasing voltage applied to the photosensor. This acceleration results in further interactions, causing an avalanche multiplication of the charge. At predetermined intervals the read and reset circuit samples the charge accumulated on photosensor pixels, and the pixels are reset to gather charge over the next sampling period. The sampled pulse is amplified and processed for display or further analysis.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A radiation imaging device comprising:
    a scintillator;
    a large area photosensor optically coupled to said scintillator and comprising an amorphous selenium photosensitive material exhibiting avalanche multiplication gain when a selected high biasing voltage is applied to said photosensor;
    a data read and reset circuit electrically coupled to said large area photosensor to selectively read the charge generated in said photosensor in response to incident light; and
    a protective thin film transistor (TFT) coupled to said data read and reset circuit to provide overvoltage protection from said selected high biasing voltage, said protective TFT comprising a gate dielectric layer having a thickness selected to cause said protective TFT to become conductive above a selected protective voltage.

2. The device of claim 1 wherein said selected high biasing voltage is between about 100 volts and 1000 volts.

3. The device of claim 1 wherein said large area photosensor has an area not smaller than about 100 $cm^2$.

4. The device of claim 1 wherein said large area photosensor comprises:
    a substantially optically transparent electrically conductive electrode disposed adjacent to said scintillator;
    a layer of amorphous selenium disposed in electrical contact with the transparent electrode;
    a blocking barrier to substantially prevent the passage of holes therethrough disposed along the surface of the selenium layer opposite said transparent electrode; and
    a contact electrode electrically coupled to said blocking barrier.

5. The device of claim 4 wherein said optically transparent electrically conductive electrode comprises indium tin oxide.

6. The device of claim 4 wherein the amorphous selenium layer is doped with arsenic or arsenic and tellurium.

7. The device of claim 4 wherein said blocking barrier comprises cerium oxide.

8. The device of claim 7 wherein said cerium oxide blocking barrier has a thickness between about 50 Å and 200 Å.

9. The device of claim 4 wherein the amorphous selenium layer has a thickness between about 0.5 μm to 10 μm.

10. The device of claim 4 wherein said contact electrode comprises one of the group consisting of molybdenum, titanium, tungsten, chromium, nickel, and gold.

11. The device of claim 1 wherein the selected thickness of said gate dielectric layer is about 1 micron.

12. The device of claim 1 wherein said scintillator comprises one of the group consisting of cesium iodide, cadmium tungstate, zinc cadmium sulfide, yttrium oxisulfide, and gadolinium oxisulfide.

13. The device of claim 1 wherein said large area photosensor has an area not less than about 100 cm$^2$.

14. An x-ray imaging device comprising:
a scintillator;
a large area photosensor comprising a plurality of photosensor pixel elements arranged in an array, each of said photosensor pixel elements coupled to said scintillator and comprising an amorphous selenium photosensitive material exhibiting avalanche multiplication gain when polarized at a selected high biasing voltage;
a data read and reset circuit electrically coupled to each of said photosensor pixel elements to selectively read charge generated in respective pixel elements in response to light; and
a plurality of protective thin film transistors (TFTs) electrically coupled to said data read and reset circuit to control said selected biasing voltage across each respective photosensor pixel element and to provide overvoltage protection to said data read and reset circuit, each of said protective TFTs comprising a gate dielectric layer having a thickness selected to cause each respective protective TFT to become conductive above a respective selected protective voltage.

15. The device of claim 14 wherein said selected high biasing voltage is between about 100 volts and 1000 volts.

16. The device of claim 14 wherein said large area photosensor has an area not smaller than about 100 cm$^2$.

17. The device of claim 14 wherein each of said photosensor pixel elements further comprises a transparent electrode disposed adjacent to said scintillator, a layer of said amorphous selenium photosensitive material disposed adjacent to said transparent electrode, a blocking barrier layer to prevent passage of holes therethrough disposed adjacent to said photosensitive material layer, and a contact electrode disposed adjacent to said blocking barrier layer.

18. The device of claim 14 wherein said data read and reset circuit comprises a plurality of rows and columns of low voltage scan and data lines respectively, each of said pixel elements being coupled to one scan line and one data line.

19. The device of claim 18 wherein each of said protective thin film transistors is coupled to a respective one of said pixel elements and is conductive above a selected protective voltage to prevent an overvoltage condition on said data read and reset circuit.

20. The device of claim 19 wherein said selected protective voltage is about 10 volts.

21. The device of claim 20 wherein the thickness of said gate dielectric layer is about 1 micron.

22. The device of claim 21 wherein each of said pixels has a cross-sectional area between about 0.2 mm$^2$ and 5 mm$^2$.

23. The device of claim 14 wherein said scintillator comprises a plurality of scintillator elements arranged in an array corresponding to the pattern of said photosensor pixel element array.

24. The device of claim 23 wherein each of said scintillator elements has substantially the same cross-sectional area as that of the respective pixel elements to which it is coupled.

25. The device of claim 14 wherein said large area photosensor has an area not less than about 100 cm$^2$.

* * * * *